United States Patent [19]

Field

[11] 4,137,098
[45] Jan. 30, 1979

[54] SOLAR ENERGY WINDOW

[75] Inventor: Richard L. Field, Gaithersburg, Md.

[73] Assignee: The United States of America as represented by the Secretary of the Navy, Washington, D.C.

[21] Appl. No.: 843,760

[22] Filed: Oct. 20, 1977

[51] Int. Cl.² .................. H01L 31/04; F24J 3/02
[52] U.S. Cl. .................. 136/89 PC; 126/270; 52/473; 52/788; 136/89 HY; 160/166 R
[58] Field of Search .................. 136/89 PC, 89 HY; 126/270, 271; 160/166 R, 236; 52/473, 616

[56] References Cited

U.S. PATENT DOCUMENTS

| | | | |
|---|---|---|---|
| 2,651,085 | 9/1953 | Kopp | 52/473 X |
| 2,888,007 | 5/1959 | Tabor | 126/270 |
| 3,981,445 | 9/1976 | Custer | 237/1 A |
| 4,050,443 | 9/1977 | Peck et al. | 126/270 |
| 4,080,221 | 3/1978 | Manelas | 136/89 PC |

Primary Examiner—John H. Mack
Assistant Examiner—Aaron Weisstuch
Attorney, Agent, or Firm—Richard S. Sciascia; Joseph M. St.Amand

[57] ABSTRACT

An energy absorbing venetian blind type device for generating electricity, providing heat, and serving as a sun shade. A plurality of slats covered with an array of photovoltaic cells are enclosed between two panes of glass of a window housing. A heat removal system using forced air cools the photovoltaic cells and collects heat for heating purposes elsewhere. The electricity generated by the photovoltaic cells is collected for immediate use or stored in storage batteries for later use.

12 Claims, 2 Drawing Figures

SOLAR ENERGY WINDOW

BACKGROUND

The present invention relates to solar energy converters and more particularly to a solar energy window which simultaneously provides both thermal and electrical energy, as well as shade.

Normally much heat escapes through windows. With the conservation of energy having become more critical, new and more useful ways to adapt solar energy to man's various needs have become more of a necessity.

SUMMARY

The instant invention uses a plurality of panels of photovoltaic cells in a housing between two glass panes to provide a solar energy window which generates electricity, heats air in a forced air system, and serves as a sun shade.

BRIEF DESCRIPTION OF THE PREFERRED EMBODIMENT

Figures 1, 2:
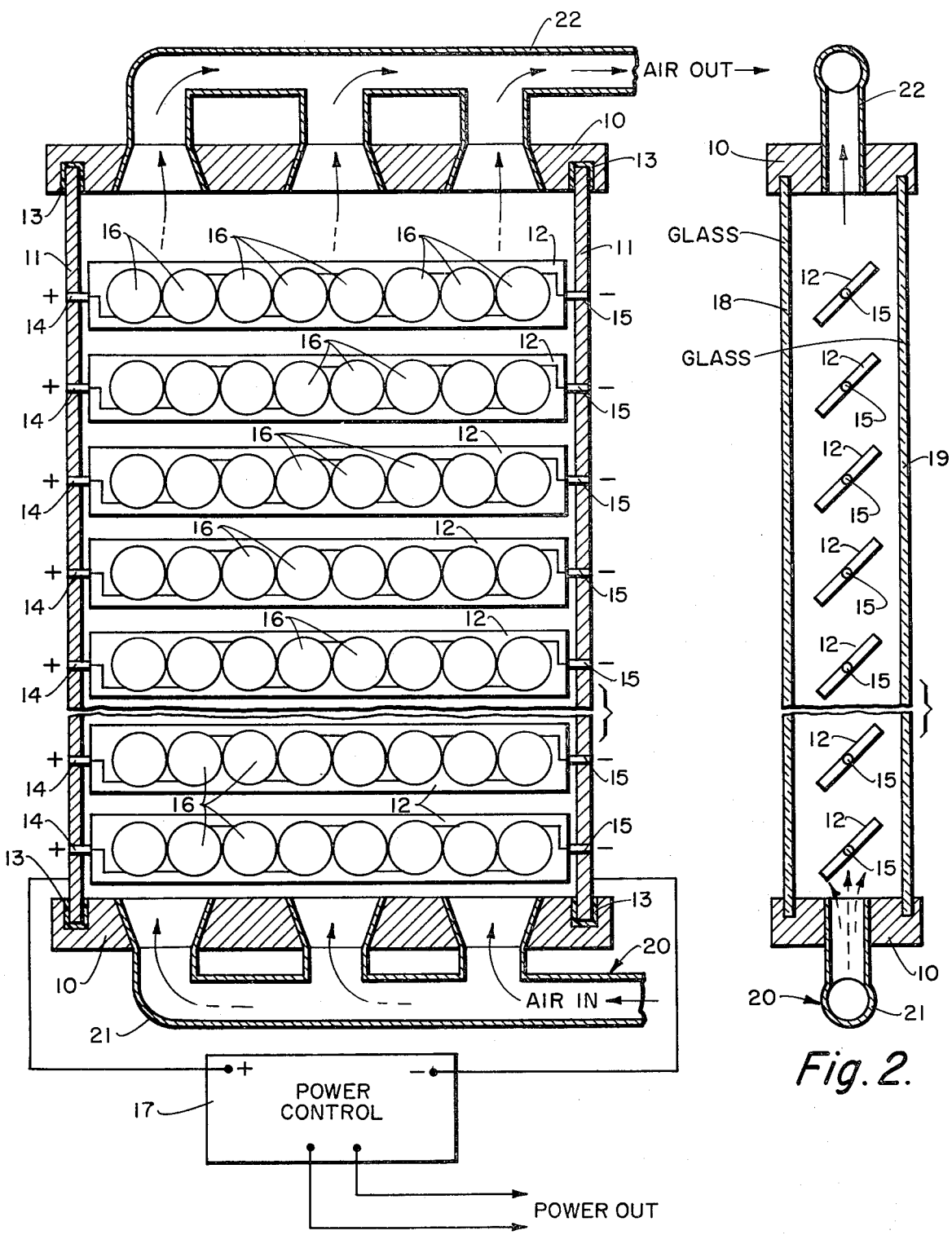
FIG. 1 is a plan view of one embodiment of the solar energy window showing movable slats of photovoltaic cells.
FIG. 2 is a cross-sectional view of the embodiment of FIG. 1.

The solar energy window shown in FIGS. 1 and 2 is comprised of an outer frame consisting of end sections 10 and side sections 11. Enclosed within the frame are a plurality of movable slats 12 which are rotatably mounted on pins 14 and 15, at opposite ends of each of the slats. Pins 14 and 15 in turn can pivot within bearings in side sections 11 of the frame. A plurality of closely spaced photovoltaic cells 16 are located in each of the slats 12.

A friction tight bearing fit can be used on either or both of the individual pins 14 and 15 of each slat to cause the slats to remain at the angle to which they are manually set. Also, the entire set of slats can be made movable in concert by any conventional gear arrangement or the like, or by means of tapes and cords as with conventional venetian blinds, in which case pins 14 and 15 would freely rotate within the bearings with a minimum of friction. Further, where the slats are used as in a conventional venetian blind, end pins can be omitted so that the slats can be drawn with a cord and tapes and gathered in a bundle at the top of the window.

The slats 12 are made from a rigid material, preferably a transparent plastic (e.g., ultraviolet resistant electronics type potting material) which serves to: encapsulate the photovoltaic cells 16; protect the cells 16 from the atmosphere when exposed to the weather; and provide structural rigidity so that the slats can be easily manipulated.

The photovoltaic cells 16 are usually electrically connected together in a series circuit to achieve desired voltage, and a plurality of series circuits of photovoltaic cells can then be connected in parallel, as desired. Ideally the number of cells in each slat would be the exact number to provide the desired voltage so that each slat would have all cells in series, and all slats would be connected in parallel to achieve desired power level.

In the embodiment shown in FIG. 1, pins 14 and 15 can be used as electrical contacts to the multiplicity of cells on each slat. Pin 14 can be connected to the positive terminal and pin 15 can be connected to the negative terminal, for example, and in turn all the slats of cells can be connected in parallel by electrically connecting the pins 14 together and pins 15 together. Side sections 11 of the frame can be of electrically conductive material to connect the slats together in parallel. Where side sections 11 are used as electrical conductors they are electrically insulated from end sections 11 at 13. Other well known means for connecting the cells or each of the various slats together to provide the desired voltage and power levels can also be used. The electrical energy can then be fed by electric lines from + and − terminals at the bottom of sections 11 to a power control 17 or other suitable distribution device, as shown in FIG. 1.

Photovoltaic slat panels reject from 80 to 95 percent of the heat energy they absorb, and at times the slats of cells must be forcefully cooled to operate properly.

The solar energy window or panel can be used in several ways: placed flat upon a roof where the spaced slat configuration aids the necessary cooling of the cells by natural connection; hung vertically behind a single pane window in a building; or, used between two panes of glass 18 and 19, as in the preferred embodiment shown in FIGS. 1 and 2.

In the preferred embodiment, as can be seen best from FIG. 2, the fore glaze 18 and the aft glaze 19 serve to admit light to the arrays of cells 16 on slats 12 and also admit light to the building, etc., which uses the solar energy window. The glazes 18 and 19 also serve to keep heat generated within the solar energy window as well as heat trapped therein from escaping directly into the building where used. A forced air flow is introduced at the bottom of the window, for example, as shown at 20 for the dual purpose of cooling the photovoltaic cells 16 and for picking up heat to be used for heating purposes, etc., in a building heating system. If the air input duct 21 and air output duct 22 are made sufficiently large, convection and rise of heat within the solar energy window will force air to flow naturally over slats 12 and photovoltaic cells 16 for cooling the cells and this heated air can be directed into a building for internal heating thereof. To increase the flow of air over the slats a forced air unit can be used to force or circulate air through the solar energy window; where heat is not needed for heating the air space in a building it can be used to supplement the heating of water, to provide hot water, or otherwise exhausted to the outside atmosphere.

When the slats of cells are used in a window configuration as shown in FIGS. 1 and 2 or when used behind a single pane of glass the slats 12 can be used to provide some control on the amount of light admitted to pass through the window, by adjusting the angle of the slats as in the operation of a conventional venetian blind. Although the plastic material of the slats is transparent, the multiplicity of cells blocks most light from passing and the spaces between cells can be made opaque by any suitable means. Using a multiplicity of rectangular shaped cells adjacent each other over the entire surface of each slat facing the sun will completely block any light from passing through the slats. Further, the slats can be made from translucent or opaque material and the photovoltaic cells mounted on the surface of the slats.

The photocells absorb the greatest energy when positioned perpendicular to rays from the sun, thus rotatable slats are needed for the purpose of aiming the cells at some optimum average sun angle, which is approximately equal to the latitude of the location. The function of aiming the photocells toward the sun can be motorized and automatically controlled by well known techniques. Changes in the electrical power generated can also be used to turn the photocells on the slats away from the sun whenever the energy being collected cannot be utilized.

Any suitable type photovoltaic cell 16 can be used in the solar energy window described herein. For example, silicon, calcium sulfide, gallium arsenide and other types of cells are suitable. The cells can be cast within the slats or mounted on the surface of the slats, as desired and the cells can be of any desired configuration; square, circular, etc. The glaze 18 or 19 through which the sun enters the solar energy window assembly can be of any suitable material. The width of slats 12 should be such that when closed, i.e., in a substantially vertical position, a minimum of light can pass through the window.

The present invention serves to operate as a storm-type window to prevent excess loss of heat from within a building and channels much of the heat normally lost through a window back into the building in addition to the heat collected from solar energy.

Obviously many modifications and variations of the present invention are possible in the light of the above teachings. It is therefore to be understood that within the scope of the appended claims the invention may be practiced otherwise than as specifically described.

What is claimed is:

1. A solar energy window, comprising:
   a. a window frame;
   b. a plurality of parallel slats pivotally mounted within said frame for rotation about their longitudinal axis;
   c. a plurality of photovoltaic cells mounted on each of said slats; the photovoltaic cells on each of the slats being electrically connected together to provide a desired voltage when excited to generate electricity;
   d. means for electrically connecting together the electrical output from each of the slats of photovoltaic cells to achieve a desired electrical power level to be used as an electrical source of power;
   e. a pair of transparent window panels mounted on said frame, one to the fore and one to the aft of said plurality of said slats thereby completely enclosing said slats within said frame and between said transparent window panels, said transparent window panels being operable to allow solar energy to pass therethrough and impinge upon the photovoltaic cells on said slats when said slats are positioned at an angle for said photovoltaic cells to receive said solar energy;
   f. means for providing an airflow through said frame, between said transparent window panels and over said slats for cooling said photovoltaic cells and for collecting heat from the solar energy window assembly.

2. A solar energy window as in claim 1 wherein means is provided for adjusting the position of said slats for receiving solar energy.

3. A solar energy window as in claim 1 wherein means is provided for channeling air to and from said solar energy window assembly for cooling said photovoltaic cells and slats, collecting heat therefrom, and distributing heated air to other locations.

4. A solar energy window as in claim 1 wherein means is provided for forcing air through said solar energy window assembly for forcefully cooling said photovoltaic cells.

5. A solar energy window as in claim 1 wherein said slats are made from transparent plastic material in which said photovoltaic cells are encapsulated.

6. A solar energy window as in claim 1 further comprising means for feeding the electrical energy generated by said photovoltaic cells to a power control means for further distribution.

7. A solar energy window as in claim 1 wherein portions of said window frame form electrical conductors for connecting together the electrical outputs of each of said slats of photovoltaic cells.

8. A solar energy window, comprising:
   a. a window frame;
   b. a plurality of parallel slats pivotally mounted within said frame for rotation about their longitudinal axis;
   c. a plurality of photovoltaic cells mounted on each of said slats;
   d. said photovoltaic cells on each of the slats being electrically connected together to provide a desired voltage when excited by solar energy;
   e. means for electrically connecting together the electrical output from each of the slats of photovoltaic cells to achieve a desired electrical power level to be used as an electrical source of power;
   f. means for providing an airflow over said slats and photovoltaic cells for cooling said photovoltaic cells.

9. A solar energy window as in claim 8 wherein said slats are made from transparent plastic material in which said photovoltaic cells are encapsulated.

10. A solar energy window as in claim 8 wherein means is provided for adjusting the position of said slats for receiving solar energy.

11. A solar energy window as in claim 8 wherein means is provided for forcing air through said solar energy window assembly for forcefully cooling said photovoltaic cells.

12. A solar energy window as in claim 8 wherein portions of said window frame form electrical conductors for connecting together the electrical outputs of each of said slats of photovoltaic cells.

* * * * *